United States Patent
El-Mansouri et al.

(10) Patent No.: US 9,542,980 B1
(45) Date of Patent: Jan. 10, 2017

(54) SENSE AMPLIFIER WITH MINI-GAP ARCHITECTURE AND PARALLEL INTERCONNECT

(71) Applicant: NANYA TECHNOLOGY CORP., Taoyuan (TW)

(72) Inventors: Adam Saleh El-Mansouri, Boise, ID (US); Adrian Jay Drexler, Boise, ID (US); Ryan Martin Hofstetter, Boise, ID (US)

(73) Assignee: NANYA TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 15/083,303

(22) Filed: Mar. 29, 2016

(51) Int. Cl.
G11C 7/10 (2006.01)
G11C 7/06 (2006.01)
G11C 7/22 (2006.01)

(52) U.S. Cl.
CPC .. *G11C 7/06* (2013.01); *G11C 7/22* (2013.01)

(58) Field of Classification Search
CPC .................................... G11C 7/06; G11C 7/22
USPC .................... 365/63, 189.02, 230.03, 230.06
See application file for complete search history.

(56) References Cited

U.S. PATENT DOCUMENTS

| | | | | |
|---|---|---|---|---|
| 5,384,726 A * | 1/1995 | Tomita | ................... | G11C 7/065 257/208 |
| 5,544,121 A * | 8/1996 | Dosaka | ................ | G11C 7/1018 365/222 |
| 6,678,204 B2 * | 1/2004 | Nagashima | .......... | G11C 7/1042 365/189.14 |
| 2002/0031035 A1 * | 3/2002 | Tsuji | ........................ | G11C 8/12 365/230.03 |

\* cited by examiner

*Primary Examiner* — Tha-O H Bui
(74) *Attorney, Agent, or Firm* — Winston Hsu; Scott Margo

(57) ABSTRACT

A memory array structure includes: a plurality of array sections and a plurality of mini-gaps, wherein each mini-gap is disposed between two array sections of the plurality of array sections. Each mini-gap includes: a local write device, for providing a data signal in response to a write enable signal and a write data signal, the data signal for performing a write operation on a memory cell of an array section; and a local sensor, for outputting a data signal in response to an activation command and a read enable signal. The memory array further includes a control logic for providing the write enable and read enable signals, and at least one main sense amplifier, for providing the write data signal to the local write device, receiving the data signal from the local sensor, and amplifying the received data signal for providing a read data signal to output data lines.

7 Claims, 5 Drawing Sheets

SENSE AMPLIFIER WITH MINI-GAP ARCHITECTURE AND PARALLEL INTERCONNECT

BACKGROUND OF THE INVENTION

1. Field of the Invention

The present invention relates to memory array sense amplifiers, array interconnection, and to memory array structures that comprise mini-gaps disposed between array sections, wherein the mini-gaps act as local sensors for detecting and distributing charge on a digit line and relaying the charge to a main sense amplifier or cell.

2. Description of the Prior Art

Sense amplifiers are essential components of integrated circuits (ICs). A standard memory array structure comprises a plurality of interconnecting word lines and digit lines. Storage devices, such as capacitors, are used for storing charge in a memory cell of the memory array. Access devices, such as transistors, are used for performing write operations to store the charge to the capacitor, and for performing read operations to read the charge stored therein.

In order to write data to a particular memory cell, the memory cell is isolated by activating a word line and digit line at the memory cell location via an access device. The access device is turned on long enough for a particular charge (representing a logical 'ONE' or 'ZERO') to charge the storage device. In order to then read the data stored therein, the access device will be activated again, so that charge is shared onto the digit line from the storage device. As the digit line has a high capacitance, the charge in the storage device will only result in a slight increase in voltage of the digit line. A sense amplifier is then used to sense the difference in charge between two digit lines, and provide the amplified output by pulling the digit line with higher voltage up to Vcc and pulling the other digit line down to ground.

The memory array described above requires a given area for the sense amplifier to operate within necessary noise and sense margin. The present invention aims to provide a memory array architecture which can provide precision sensing while reducing digit-line-to-digit-line noise as well as reducing the overall sense amplifier footprint.

SUMMARY OF THE INVENTION

A memory array structure comprises: a plurality of array sections and a plurality of mini-gaps, wherein each mini-gap is disposed between two array sections of the plurality of array sections. Each mini-gap comprises: a local write device, for providing a data signal in response to a write enable signal and a write data signal, the data signal for performing a write operation on a memory cell of an array section; and a local sensor, for performing a read operation on the memory cell upon receiving an activation (read enable) command. The memory array further comprises: a control logic block, for providing the write enable signal to the local write or the array, and providing the read enable signal to the local sensor or the array; and at least one main sense amplifier, for providing the write data signal to the local write device or the array, as well as receiving a data signal from the local sensor, and amplifying the received data signal for providing a read data signal to output data paths leading to an external memory.

Each array section comprises: at least two digit lines; and a plurality of word lines intersecting with the at least two digit lines. The layout area required for connecting the mini-gap architecture can be further reduced by utilizing an interconnect layer formed over the top of the intersecting word lines and digit lines; and a multiplexer, for selecting between the at least two digit lines. The memory array structure further comprises a second main sense amplifier, connected to the same physical set of digit lines as the first main sense amplifier. The multiplexer selects between the at least two digit lines so that the first main sense amplifier and the second main sense amplifier are both individually coupled to the two digit lines. The multiplexed connections allow for parallel resistance paths to be formed on a portion of the total digit line length between the first main sense amplifier or the second main sense amplifier and the storage cell.

These and other objectives of the present invention will no doubt become obvious to those of ordinary skill in the art after reading the following detailed description of the preferred embodiment that is illustrated in the various figures and drawings.

DETAILED DESCRIPTION

The present invention proposes a memory array architecture comprising a plurality of mini-gaps which act as local sensors/repeaters for providing input to a main sense amplifier as well as local signal boost during storage cell writes. The invention also proposes a method of interconnection allowing these mini-gaps to be integrated into an array with a vertical access device type. The invention further proposes an additional method of interconnection allowing for parallel resistance paths within an array of the same vertical access device type.

Figure 1A:
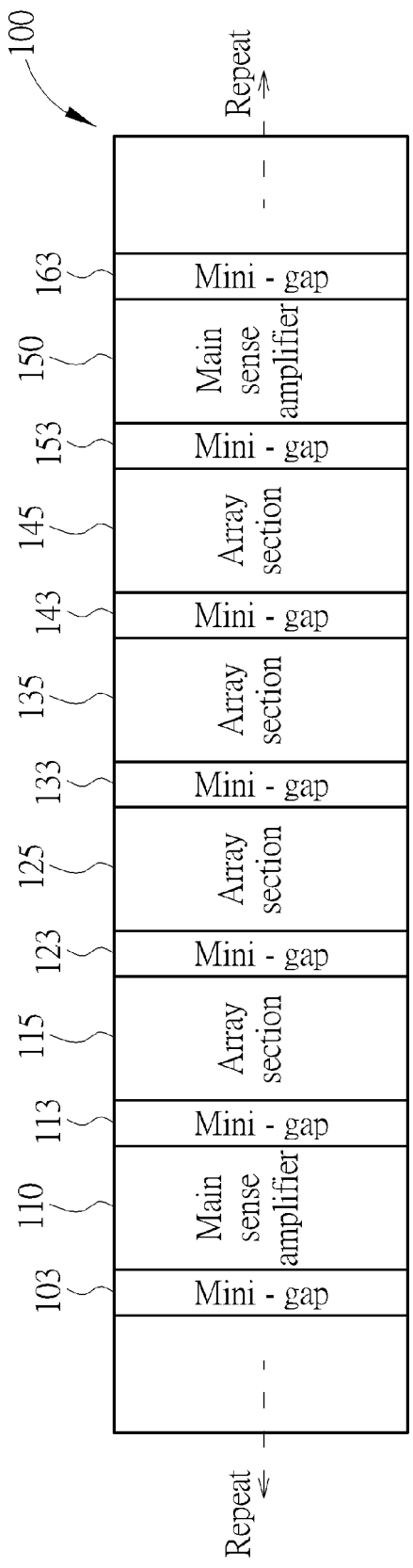
FIG. 1A is a diagram illustrating a memory array layout according to an exemplary embodiment of the present invention utilizing mini-gaps.

Please refer to FIG. 1A, which is a diagram illustrating the primary topology of the disclosure. FIG. 1A is a diagram of a memory array 100, comprising two main sense amplifiers 110, 150 and a plurality of array sections 115, 125, 135, 145. Mini-gaps 103, 113, 123, 133, 143, 153, 163 are disposed between each array section and function as local sensors for performing local read and write operations. The number of sense amps, sections, and mini-gaps illustrated are merely provided as an example; in practice, the number of array sections and mini-gaps will depend on the particular type of mini-gap implemented in the system as limited by the electrical characteristics of the array type.

To aid understanding of this disclosure, the exemplary embodiment illustrated above uses a hierarchal digit line (HDL) architecture, wherein the sense amplifiers and mini-gaps are selectively coupled to digit line pairs. This method of interconnection is utilized to reduce the number of sense amps and mini-gap circuits, although mini-gap architecture does not require connection to pairs of digit lines. This method of interconnection will be described in detail later. It should be noted that this particular embodiment is not meant to be taken in a limiting sense, and other architectures can be utilized to realize the function of the invention.

Figure 1B:
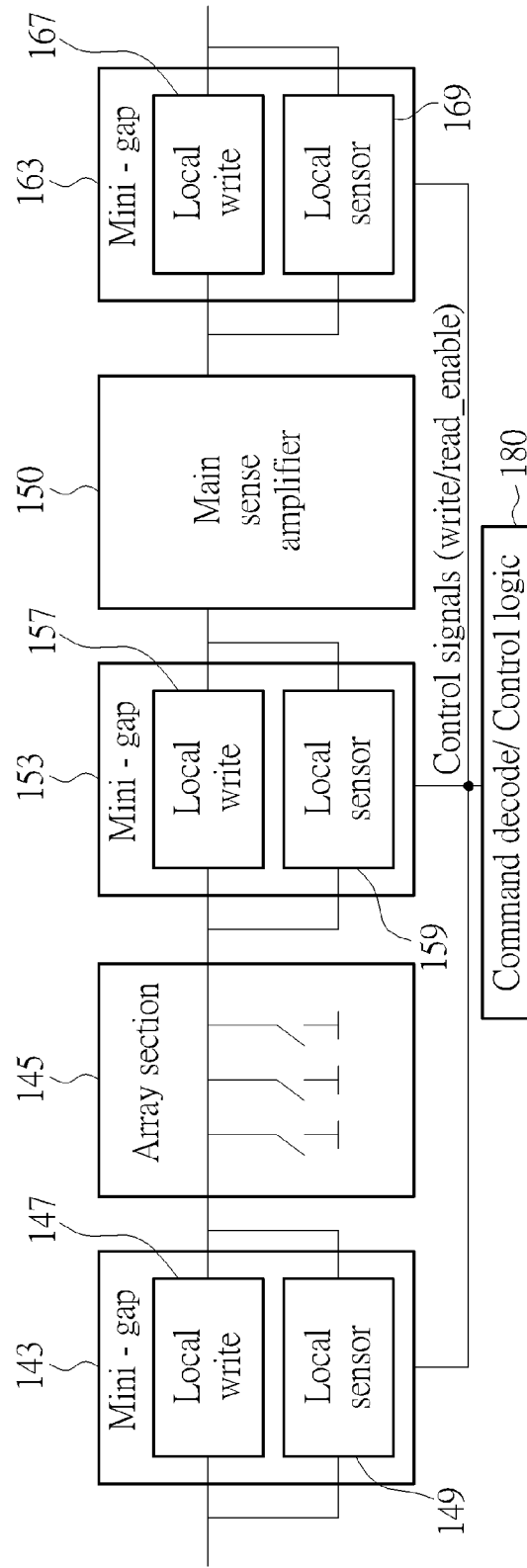
FIG. 1B is a diagram illustrating the block interconnection of the memory array illustrated in FIG. 1A.
Figure 2:
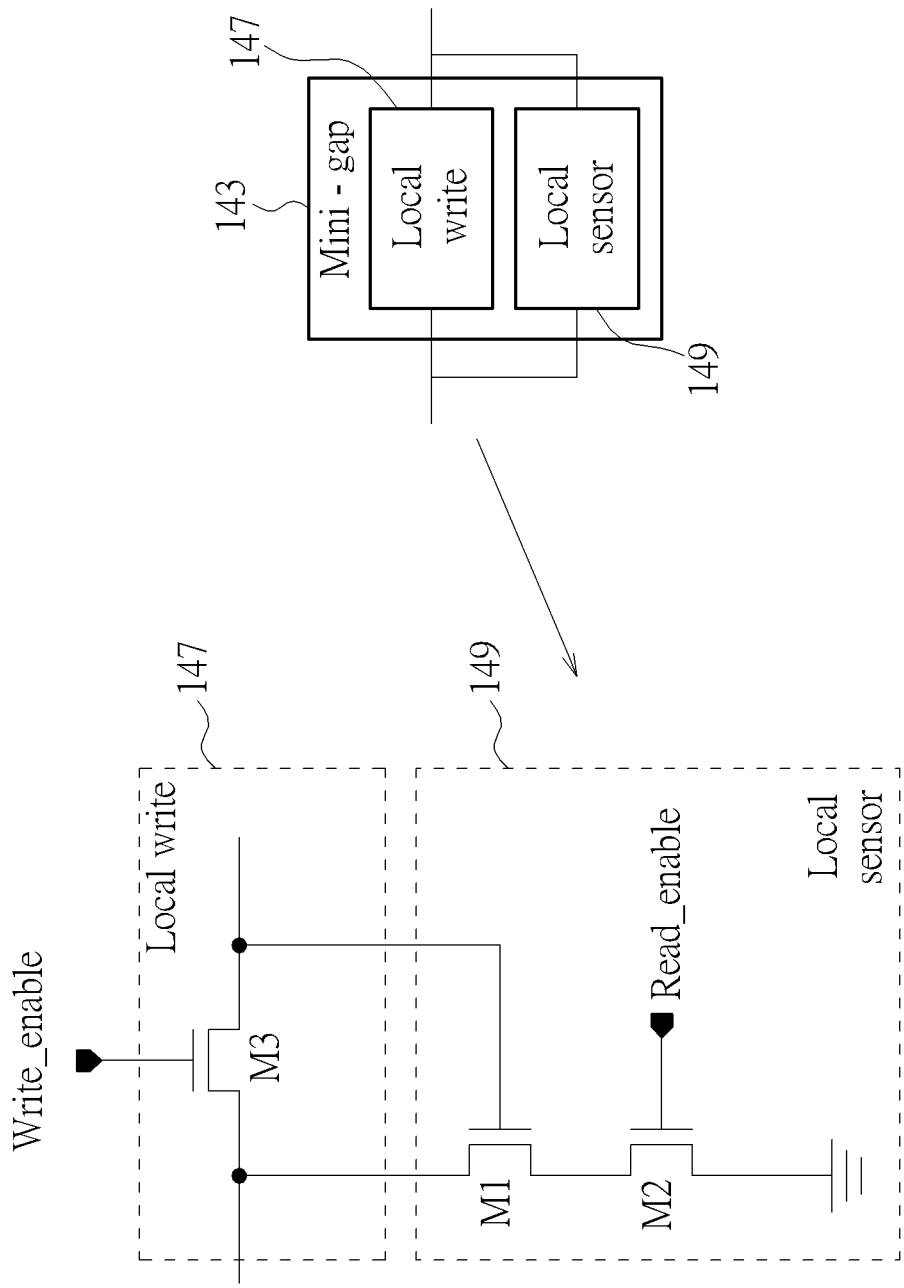
FIG. 2 illustrates an exemplary embodiment of a mini-gap illustrated in FIG. 1.

As illustrated in FIG. 1B, mini-gap 143 is composed of a local write device 147 and a local sensor 149. Please refer to FIG. 2, which illustrates an exemplary embodiment of mini-gap 143 illustrated in FIG. 1A and FIG. 1B. In this embodiment, the local write device is implemented by an NMOS device M3 having a write_enable signal input to the gate, and coupled between a main sense amplifier and a digit line pair. The local sensor 149 is composed of two NMOS devices M1 and M2, where M1 is coupled across M3 and M2 is coupled between M1 and ground. A read_enable signal is provided to the gate of M2 for performing local read operations. In this embodiment, M2 can be a global device and M3 can be implemented by the access device since this embodiment uses hierarchal digit line architecture.

An activation command ('read_enable') is provided to the gate of M2, which allows M1 to turn on. The device M3 is off during a read command, thus isolating the digit-line to sense amplifier contact. M1 can therefore sense the voltage transferred on the digit line due to the charge dumping which will occur on its gate, and relay the result to the main sense amplifier. As M1 will undergo a current change due to the charge dumping, this device amplifies the relative signal change so that the main sense amplifier can detect and amplify this current change, which will represent the charge stored in the memory cell. M1 therefore provides added sensing function while reducing the overall sense amplifier area foot print.

As illustrated in FIG. 1B, write enable and read enable signals are provided by command decode/control logic block 180 to the mini-gap. This control logic is well-known in the art. Further, read/write commands are sent from pre-existing circuitry via the sense amplifiers in order to send and receive data, wherein said data is directly sent to the array or to a mini-gap and directly received from the array or mini-gap. The mini-gaps use the write/read data signals from the sense amplifier and the enable signals from the control logic 180 to generate data signals in response.

In order to more efficiently implement the above method, good interconnections between the mini-gaps, digit lines and sense amplifiers are required. The present invention therefore proposes a parallel interconnection method. This interconnection method will be described below.

Figure 3:
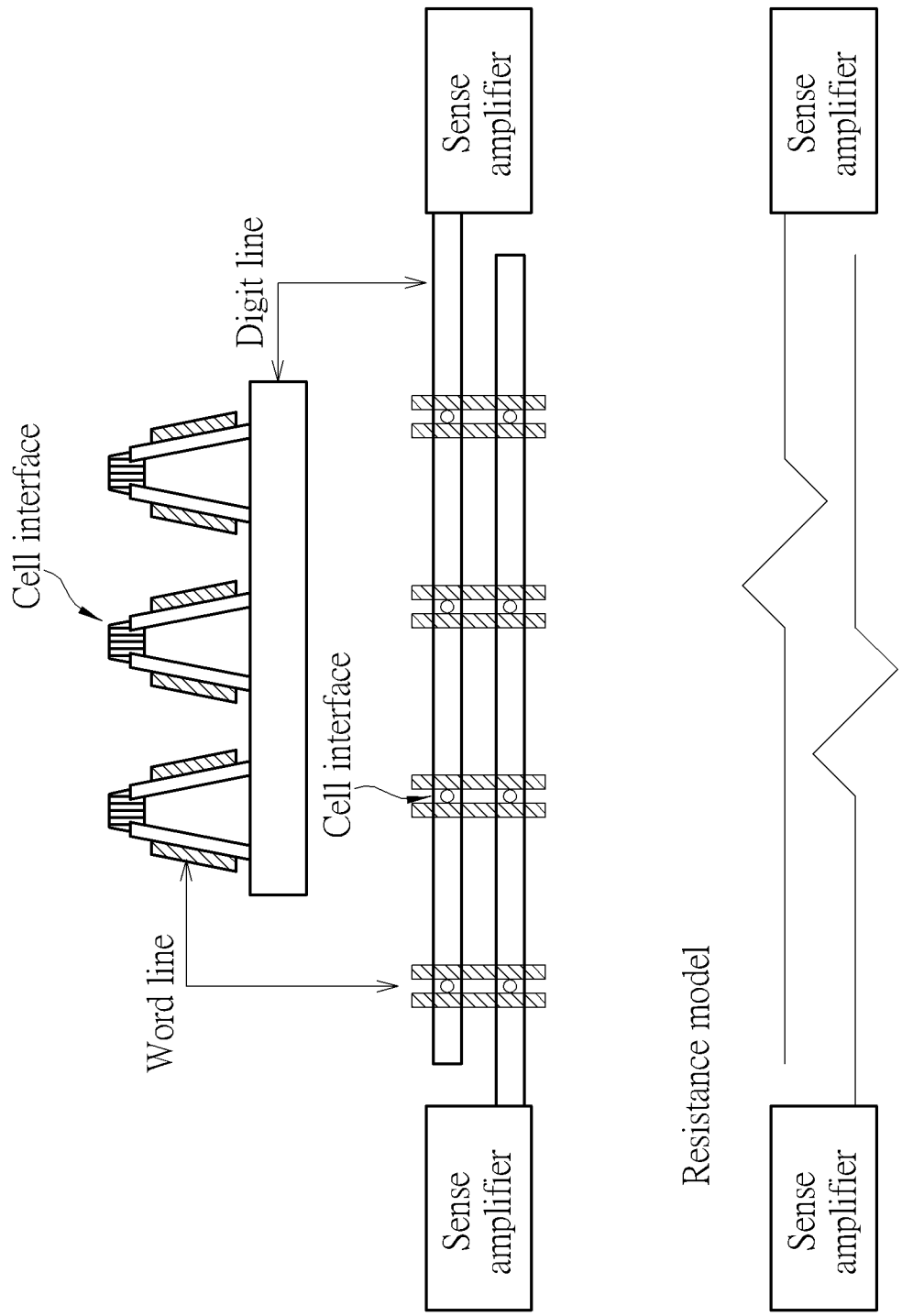
FIG. 3 illustrates a conventional cell interface according to vertical access device technology.

In a hierarchical digit line (HDL) structure, many layers of digit lines can be disposed in an array, and vertical access devices can be utilized as switches in order to connect to a particular digit line layer. Please refer to FIG. 3, which illustrates a conventional cell interface according to vertical access device technology. The cell interface is illustrated in three different ways: a side view at cell level, a top-down view at the connection level, and a first-order resistance model. As illustrated in the diagram, a number of vertical access devices are formed with word lines on the sidewalls of the access devices. A top layer interconnect/cell interface is used to couple the digit lines via the access devices. This allows a first digit line to be coupled to a main sense amplifier and a storage cell. A second digit line may be coupled to another main sense amplifier. Two individual resistance paths are therefore created.

The present invention utilizes the access devices as switches or multiplexers (MUX) which can select between the two digit lines. By selectively coupling to the first or second digit line, the sense amplifier can connect two digit line pairs, creating parallel or individual resistance paths depending on the state of the MUX and enabling half the connections needed at the mini-gap.

Figure 4:
FIG. 4 illustrates the utilization of an interconnection method allowing for use of the mini-gap embodiment of FIG. 2 to interface with the cell technology of FIG. 3

Please refer to FIG. 4, which illustrates part of the above concept. As shown in the diagram, a top layer interconnect/cell interface is used. Via selectively enabling connection between a first digit line and selectively disabling connection between a second digit line at the main sense amplifier node, individual resistance paths are created from the parallel connection. In order to isolate a storage cell to a local sensor in a particular mini-gap, the switches will be open so that the active section has only an individual digit connected to a given sense amp.

By providing the parallel interconnect method in an HDL architecture, mini-gaps can be created between array sections of a memory array which act as local sensors without the number of circuits needing to be at the same frequency or pitch as the digit lines. These local sensors can detect charge during current dumping (i.e. during read operations) and relay the detected charge to a main sense amplifier for completing the read operation. The use of these mini-gaps for sensing charge therefore reduces the overall area footprint of the sense amplifiers. Further, access devices in the HDL architecture can be used to implement the mini-gaps.

Figure 5:
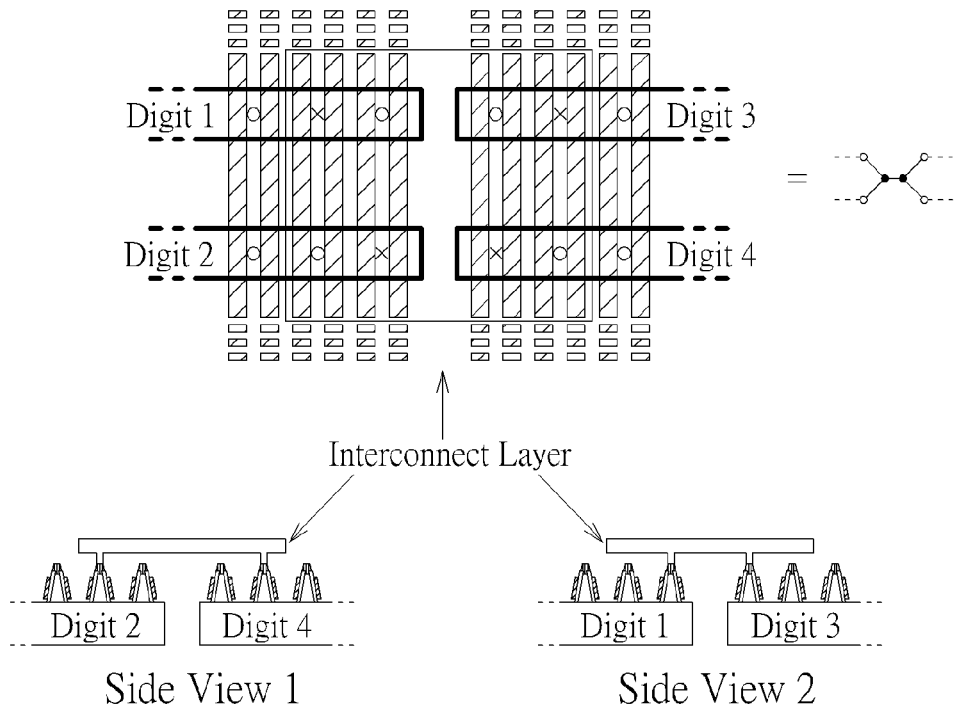
FIG. 5 illustrates an interconnection method of a memory array allowing for connection of digits in a parallel resistance configuration as may be utilized in FIG. 4.
Figure 5:
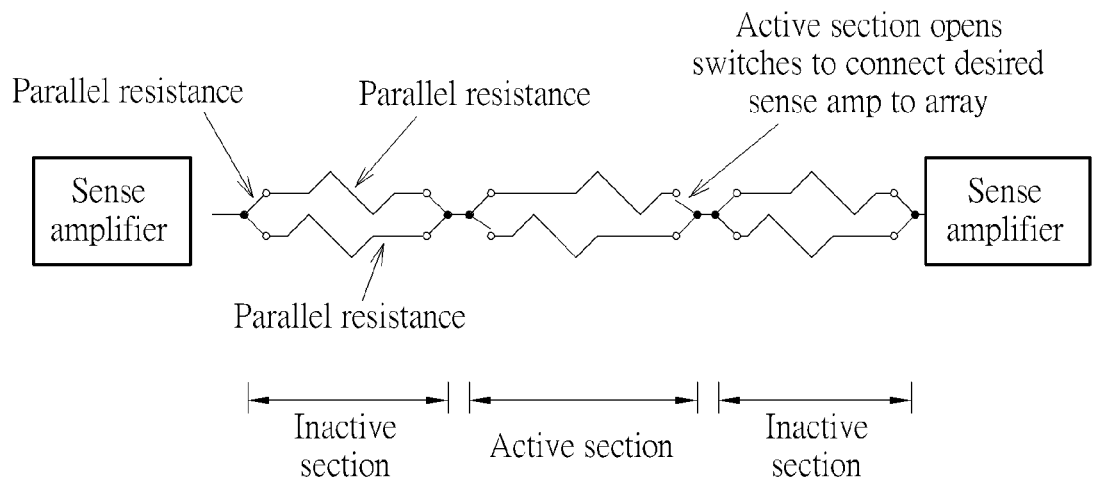

Please refer to FIG. 5, which illustrates the combination of the individual connection to active sections described above as well as providing a breakdown of a gap allowing parallel connection without any mini-gap circuitry. The resistive diagram shows how, when there are three or more sections, parallel connections can be maintained in inactive sections.

The parallel interconnect method therefore allows for the main sense amplifiers to couple to digit-line pairs, which reduces digit-line coupling noise as well as reducing resistance.

To summarize, the memory array architecture described above can provide precision sensing while reducing digit-line-to-digit-line noise as well as reducing the overall sense amplifier footprint.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory array structure, comprising:
   a plurality of array sections, each array section comprising a plurality of memory cells;
   a plurality of mini-gaps, each mini-gap disposed between two array sections of the plurality of array sections and comprising:
      a local write device, for providing a data signal in response to a received write enable signal and write data signal, the data signal for performing a write operation on a specific memory cell of an array section; and
      a local sensor, for outputting a data signal upon receiving an activation command and a read enable signal;
   a control logic, for providing the write enable signal and the read enable signal; and
   at least a first main sense amplifier, for providing the write data signal to the local write device, receiving the data signal from the local sensor, and amplifying the received data signal for providing a read data signal to output data lines.

2. The memory array structure of claim 1, wherein the local write device is implemented by an NMOS coupled between the main sense amplifier and a digit line of an array section, and the local sensor is implemented by a first NMOS coupled between the local write device and a second NMOS coupled between the first NMOS and ground.

3. The memory array structure of claim 1, wherein the memory array structure has a hierarchical digit line architecture, and the local write device is an access device.

4. The memory array structure of claim 1, wherein each array section comprises:
   at least two digit lines;
   a plurality of word lines intersecting with the at least two digit lines;
   an interconnect layer formed over the top of the intersecting word lines and digit lines; and
   at least two multiplexers, for selecting between the at least two digit lines;
   and the memory array structure further comprises:
   a second main sense amplifier, disposed at an opposite end of the memory array from the first main sense amplifier;
   wherein multiplexers select between the at least two parallel connected digit lines so that the first main sense amplifier and the second main sense amplifier are both coupled to individual digit lines, so that multiplexers select unique resistance paths between the first main sense amplifier and the second main sense amplifier.

5. The memory array structure of claim 4, wherein there is at least a mini-gap between the first main sense amplifier and the second main sense amplifier, and in a read operation, the mini-gaps transmit the data to the main sense amps.

6. The memory array structure of claim 1, wherein the first sense amplifier is a cross-coupled sense amplifier.

7. The memory array structure of claim 1, wherein the local write device is an access device.

* * * * *